United States Patent [19]

Hirata

[11] Patent Number: 4,888,784
[45] Date of Patent: Dec. 19, 1989

[54] SEMICONDUCTOR LASER DEVICE

[75] Inventor: Shoji Hirata, Kanagawa, Japan

[73] Assignee: Sony Corporation, Tokyo, Japan

[21] Appl. No.: 182,492

[22] Filed: Apr. 18, 1988

[30] Foreign Application Priority Data

Apr. 23, 1987 [JP] Japan ................................ 62-100763

[51] Int. Cl.$^4$ ............................................... H01S 3/19
[52] U.S. Cl. ......................................... 372/46; 372/45; 372/96
[58] Field of Search ....................... 372/46, 96, 45, 44, 372/43, 102; 357/17, 16

[56] References Cited

U.S. PATENT DOCUMENTS 4,615,032  9/1986  Holbrook et al. ..................... 372/45
4,647,953  3/1987  Okaijima et al. ..................... 372/46

Primary Examiner—William L. Sikes
Assistant Examiner—Georgia Y. Epps
Attorney, Agent, or Firm—Hill, Van Santen, Steadman & Simpson

[57] ABSTRACT

A semiconductor laser device including a first semiconductor layer having a strip waveguide structure to obtain optical confinement and a second semiconductor layer having a ridge waveguide structure for defining an electrical current passage region. The strip waveguide structure has a first width, and projects on the first semiconductor layer, extending over the central area of the layer in a longitudinal direction. The ridge waveguide structure projects on the second semiconductor layer and extends in the longitudinal direction with a second width which corresponds to the strip structure. The strip waveguide structure cooperates with the ridge waveguide structure to produce a difference between the refractive index of a center region which extends in the longitudinal direction of the second semiconductor and that of a neighboring region due to the difference in thicknesses between the two, so that the center region serves as an optical waveguide.

34 Claims, 4 Drawing Sheets

SEMICONDUCTOR LASER DEVICE

BACKGROUND OF THE INVENTION

1. Field of the Invention

The present invention relates generally to a semiconductor laser device. It is specifically directed to an improved semiconductor device which, due to a difference between the refractive index of the waveguide portion and the neighboring region results in optical confinement of the emitted light so that the width of the region through which the electrical current passes can be reduced.

2. Description of the Prior Art

The prior art includes semiconductor laser devices having a ridged waveguide structure in which the width of the current passing region is reduced. Referring to FIG. 7, there is shown a distributed feedback semiconductor laser (DFB laser) in which a ridged waveguide structure is employed. The structure includes a semiconductor substrate 50 of a given conductivity type made, for example, of an n-type GaAs, having a major surface. A semiconductor cladding layer 52 having the same conductivity type as the semiconductor substrate 50 and composed, for example, of an n-type AlGaAs is formed on the major surface of the substrate 50 by means of epitaxial growth. An active semiconductor layer 54 made, for example, of GaAs, is then formed on the cladding layer 52 in the same manner. A semiconductor guiding layer 56 having a conductivity opposite to that of the cladding layer 52 and composed, for example, of a p-type AlGaAs is formed on the active layer 54 in the same manner. A periodically corrugated surface which serves as a diffraction grating 58 is formed on the surface of the guiding layer 56 opposite from the active layer 54. The diffraction grating covers the entire surface of the guiding layer and is composed of corrugations which extend laterally, are triangular in cross section, and have a regular pitch interval. After the diffraction grating 58 is formed on the guiding layer 56, a semiconductor cladding layer 60 of the same conductivity characteristics as the guiding layer 56 and composed, for example, of a p-type AlGaAs is formed on the guiding layer 56 by means of epitaxial growth. Then, a semiconductor cap layer of the same conductivity type as the cladding layer 60 and composed, for example, of a p-type GaAs is formed on the cladding layer 60 in the same manner. An etching process is performed selectively to remove both side regions of the cap layer 62 and the cladding layer 60, leaving a central region thereof extending in the longitudinal direction, and the entire lower region of the cladding layer 60, the cap layer 62 comprising only the central region. The cladding layer 60 has a T-shaped cross section. As a result, a stripe structure is formed by the cap and cladding layers 62 and 60. The surfaces of the removed portions of the cap and cladding layers 62 and 60 are covered with insulation films 64. The top surface of the cap layer 62 and the bottom surface of the substrate 50 are provided with counter electrodes 66 and 68 so as to establish ohmic contacts.

In this type of semiconductor laser device, the flow of current can be restricted to a narrow current passing region. However, this type of device does not provide good optical confinement. In order to achieve good optical confinement, the device must be designed to have about 0.01 difference in the refractive index between the central waveguide region and the neighboring region. This difference depends on the effective thickness of the guiding layer 56 (GL) and the thickness d of the neighboring region of the cladding layer 56. However, it is difficult to obtain the desired difference in refractive index by adjusting the thicknesses since the allowable error is so small. Therefore, a device of this type cannot be produced which has consistently predictable optical confinement characteristics.

There has also been proposed a DFB laser having a waveguide which comprises a narrow strip for obtaining uniform and reproducible optical confinement characteristics. One such device is illustrated in FIG. 8 and includes a semiconductor substrate 70 of a given conductivity type composed, for example, of a n-type GaAs, having a major surface. A semiconductor cladding layer 72 of the same conductivity type as the substrate 70 and composed, for example, of n-type AlGaAs is formed on the major surface of the substrate 70 by means of epitaxial growth. An active semiconductor layer 74 composed, for example, of GaAs is then formed on the cladding layer 72 in the same manner. A semiconductor guiding layer 76 having conductivity characteristics opposite to that of the cladding layer 72 and made, for example, of a p-type AlGaAs is formed on the active layer 74 in the same manner. Then, a corrugated strip 78 having a regular period of repitition and which serves as a diffraction grating is formed on the surface of the guiding layer 76 opposite to the active layer 74. Corrugated strip 78 extends over the central region of the guiding layer 76 in a longitudinal direction. The strip 78 defining the diffraction grating is composed of corrugations having a regular pitch and extending perpendicularly to the longitudinal axis thereof. After the diffraction grating 78 is formed on the guiding layers 76, a semiconductor cladding layer 80 of the same conductivity characteristics as the guiding layer 76 and formed, for example, of a p-type AlGaAs is formed on the guiding layer 76 by way of epitaxial growth. Then, a semiconductor cap layer 82 of the same conductivity characteristics as the cladding layer 80 and composed, for example, of a p-type GaAs is formed on the cladding layer 80 in the same manner. Thereafter, ion implantation is performed by injecting ions such as boron ions or the like from the cap layer 82. High resistance current restricting regions 84 are formed on both sides of the cap layer 82 so as to insulate the sections adjacent to central region extending in the longitudinal direction. A pair of counter electrodes 86 and 88 are provided on the top surface of the cap layer 82 and the bottom surface of substrate 70 to establish ohmic contacts therebetween.

This type of semiconductor laser device effectively achieves good optical confinement due to the differences in the refractive indices of the respective sections thereof. However, the current passing region cannot be made narrow so as to increase the reactive current since there is no mechanism for restricting the flow of current to a well defined area within the cladding layer 80.

The aforementioned disadvantages of the semiconductor laser device having a ridged waveguide structure or the narrow strip can also be observed in conventional Fabry-Pe'rot semiconductor lasers.

SUMMARY OF THE INVENTION

The present invention seeks to eliminate the aforementioned disadvantages and to provide a semiconductor laser device which can effectively achieve good optical confinement due to differences in refractive indices, and which also has a narrow current passing region. These effects can be consistently obtained in the devices of the present invention.

In order to accomplish these results, a semiconductor laser of the present invention includes ridge structures and a strip which is defined in the light guide.

More specifically, the semiconductor laser device of the invention may include a semiconductor substrate having a cladding layer thereon of the same conductivity type. A laser active layer is disposed on the cladding layer on the side opposite from the semiconductor substrate. A second semiconductor layer of the opposite conductivity type is disposed on the laser active layer and has a strip waveguide structure for obtaining optical confinement. The strip waveguide structure projects from the second semiconductor layer on the opposite side from the laser active layer and extends to the central area of the second semiconductor layer in a longitudinal direction. A third semiconductor cladding layer of the second named conductivity type is disposed on the strip waveguide. A third semiconductor cladding layer having a ridged waveguide structure for defining the current passage region extends in the longitudinal direction with a width which corresponds to the strip structure. A fourth semiconductor layer of the second conductivity type is disposed on the ridge waveguide structure, and a pair of electrodes is included for supplying a bias voltage, one being connected to the semiconductor substrate and the other to the fourth semiconductor layer.

The refractive index of the third semiconductor cladding layer differs from that of the neighboring region due to the difference in thicknesses so that the center region serves as an optical waveguide. The difference between the refractive indices of the center and neighboring regions may be approximately 0.01 and is preferably in the range from 0.008 to 0.015. The difference in refractive index due strictly to the strip waveguide structure is preferably from 0.007 to 0.013. The ridged structure may project in a perpendicular direction to the third semiconductor cladding layer. The third semiconductor layer may have a plate portion and a ridged portion and has a T-shaped cross section. The thickness of the plate portion may be approximately equal to or less than 5,000A. The thickness of the third semiconductor is approximately 15,000A. The strip waveguide structure may project in a perpendicular direction with respect to the second semiconductor layer. The semiconductor laser device may comprise a Fabry-Pe'rot laser device. The strip waveguide structure may have a periodically corrugated surface which serves as a diffraction grating. The grating may be composed of laterally extending corrugations of regular pitch and of essentially triangular cross section.

In accordance with another phase of the present invention, there is provided a distributed feedback semiconductor laser device which includes a semiconductor substrate of a first conductivity type and a semiconductor cladding layer of the same conductivity type located on the major surface of the semiconductor substrate. A laser active layer is disposed on the cladding layer on the side opposite from the semiconductor substrate. A second semiconductor layer of opposite conductivity type is disposed on the laser active layer and includes a strip waveguide structure having a periodically varying corrugated surface which serves as a diffraction grating. The strip waveguide structure projects from the second semiconductor layer on the side opposite from the laser active layer and extends over the central area of the second semiconductor layer in a longitudinal direction. The corrugated surface has corrugations which extend in a lateral direction perpendicular to the longitudinal direction. A third semiconductor cladding layer of the opposite conductivity type is disposed on the strip waveguide structure and has a ridge waveguide structure for defining an electrical current passing region. The ridge structure projects from the side opposite to the second semiconductor layer and extends in the longitudinal direction. A fourth semiconductor layer of the opposite conductivity type is disposed on the ridge waveguide structure and a pair of electrodes is included for supplying bias voltage, one of the electrodes being connected to the semiconductor substrate and the other to the fourth semiconductor layer.

BRIEF DESCRIPTION OF THE DRAWINGS

The present invention will be described more completely in conjunction with the accompanying drawings of a preferred embodiment of the invention. These drawings are strictly for the purpose of explanation and understanding only.

DESCRIPTION OF THE PREFERRED EMBODIMENTS

Figure 1:
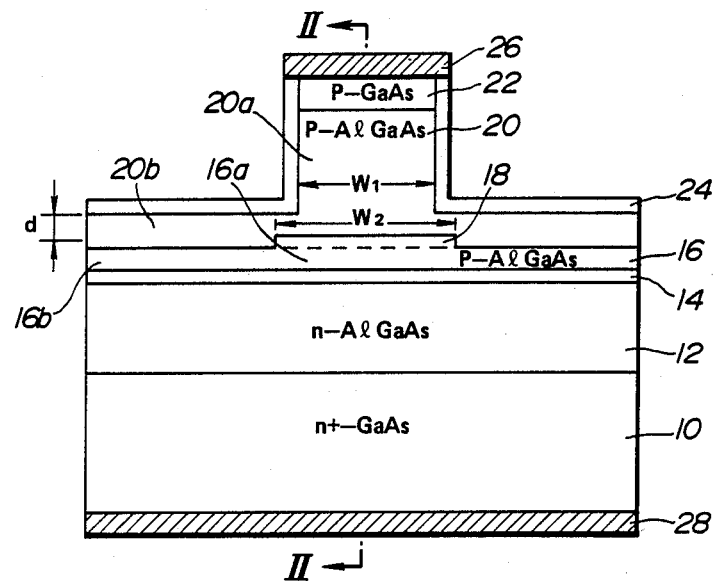
FIG. 1 is an expanded sectional view of a first preferred embodiment of a semiconductor laser device produced according to the present invention.
Figure 2:
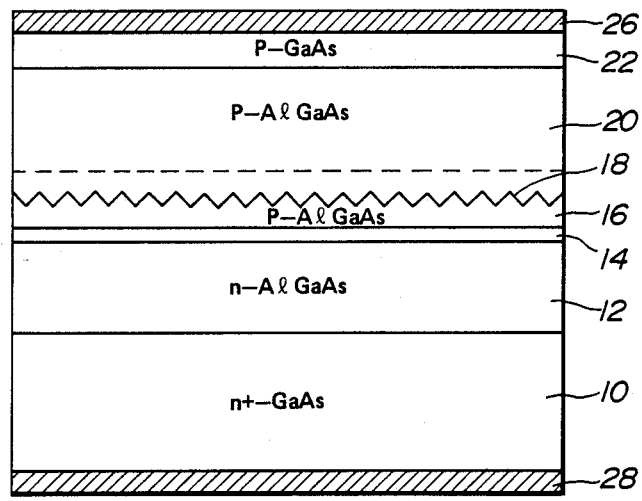
FIG. 2 is a cross-sectional view taken along the line II–II of FIG. 1.

Referring to the drawings, particularly to FIGS. 1 and 2, the preferred embodiment of a distributed feedback semiconductor laser according to the present invention includes a semiconductor substrate 10 having one conductivity type, such as an n-type GaAs which has a major surface. A semiconductor cladding layer 12 of the same conductivity type as the substrate 10, and preferably consisting of n-type AlGaAs is formed on the major surface of the substrate by means of epitaxial growth. An active semiconductor layer 14 composed, for example, of intrinsic GaAs, is then formed on the cladding layer 12 in the same manner. A semiconductor guiding layer 16 of the second conductivity type opposite to that of the cladding layer 12 is formed on the active layer 14 in the same manner. The guiding layer 16 may consist, for example, of a p-type AlGaAs. A periodically corrugated strip 18 serving as a diffraction grating is formed on the surface of the guiding layer 16 opposite from the active layer 14. The corrugated strip extends over the central area of the surface of the guiding layer 16 in a longitudinal direction whose width is $W_2$. The guiding layer 16 consists of a thicker central portion 16a on which the corrugated strip 18 is formed and a pair of thinner plate portions 16b formed on either side of the corrugated strip 18. The effective thickness of the central portion 16a of guiding layer 16 which defines the waveguide is thicker than that of the plate portion 16b. The corrugated strip 18 is composed of corrugations which are essentially triangular in cross section, have a regular pitch, and extend perpendicular to the longitudinal axis of the strip. After the corrugated strip 18 is formed on the guiding layer 16, a semiconductor cladding layer 20 of the same conductivity as that of the guiding layer 16 and composed of a p-type AlGaAs, for example, is formed on the guiding layer 16 by way of epitaxial growth so as to cover the entire surface including the thicker central portion 16a and the thinner plane surface of the guiding layer 16. The band gap of the cladding layer 20 is larger than that of the guiding layer 16 and the active layer 14. A semiconductor cap layer 22 having the same conductivity as that of the cladding layer 20 and made of a p-type GaAs, for example, is formed on the cladding layer 20 in the same manner. Thereafter, an etching process is performed to selectively remove the side portions of the cap layer 22 and the cladding layer 20 to a predetermined depth. A central portion of the cap layer 22 and a portion of the cladding layer 20 having a T-shaped cross section remain after the etching process. The cladding layer 20 comprises a ridged portion 20a having a width $W_1$ and a plate portion 20b having a thickness d. The ridged portion 20a projects upwardly from the guide layer 16 at a location corresponding to the corrugated strip 18 and extends in the longitudinal direction. The cap layer remains only at the top of the ridged portion 20a. As a result, a ridged waveguide structure is formed by the cap and cladding layers. The surfaces of the removed portions of the cap and cladding layers 22 and 20 are covered with insulation films 24. Moreoever, the top surface of the cap layer 22 and the bottom surface of the substrate 10 are provided with electrodes 26 and 28 so as to establish ohmic contacts therebetween, respectively.

The DFB laser of the present invention has characteristics of both the ridged and strip structures. The characteristics of such a laser device will now be described.

The thickness of the ridge portion should be two or more times that of the plate portion in order to sufficiently prevent the flow of electrical current from spreading laterally and to keep the current flow restricted to a narrow area. The ridged structure differs from a mesa electrode structure in that the thickness d of the plate portion 20b of the cladding layer 20 is equal to or less than about 5,000Å and the thicknesses of the ridge portion 20a of cladding layer 20 and the cap layer 22 are about 15,000Å and 5,000Å respectively, whereas the thickness d is more than about 10,000Å in the mesa structure. In an embodiment, the thickness of the third semiconductor layer is 15,000Å. As will be described below, the magnitude of difference between the refractive indices of the ridged and plate portions 20a and 20b of the cladding layer begins to be significant when their thicknesses have the aforementioned values. The ridged structure may restrict the flow of electrical current to a narrow region more effectively than does the mesa structure.

In order to achieve the desired electrical current restricting effect, the difference $\Delta N$ between the refractive indices of the ridged and plate portions should be at least about 0.01. Since the allowable range of refractive index difference $\Delta N$ is, from experience, from 0.08 to 0.015, a difference $\Delta N$ in this range will be considered below.

Figure 3:
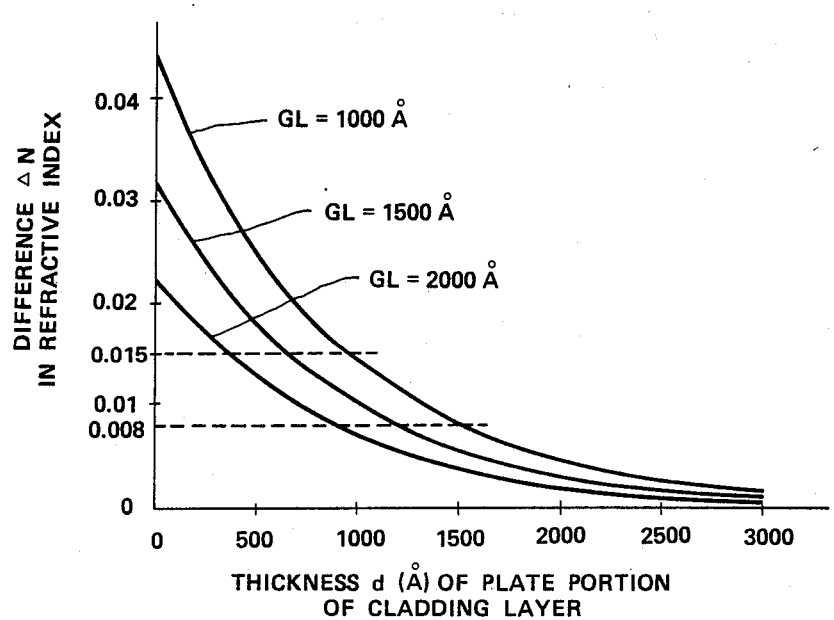
FIG. 3 is a graph showing the relationship between the thickness d of the plate portion of the cladding layer and the difference $\Delta N$ in refractive index with respect to various effective thicknesses of guiding layer (GL) in a semiconductor laser device with a ridged waveguide structure.
Figure 4:
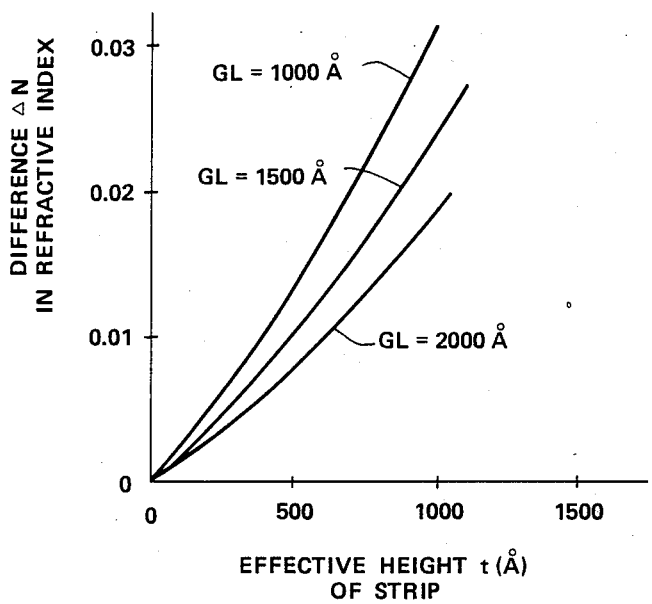
FIG. 4 is a graph of the difference $\Delta N$ in refractive index versus the effective height of the strip structure with respect to various effective thicknesses of guiding layer in a semiconductor laser having a strip waveguide structure.

FIG. 3 shows the relationship between the thickness d of the plate portion of the cladding layer and the magnitude of difference $\Delta N$ in refractive index, with respect to various effective thicknesses of guiding layer (GL) in the ridge waveguide structure semiconductor laser device. FIG. 4 shows the difference $\Delta N$ in refractive index related to the effective height of the strip structure with respect to various effective thicknesses of guiding layer in the strip waveguide structure semiconductor laser.

Figure 5:
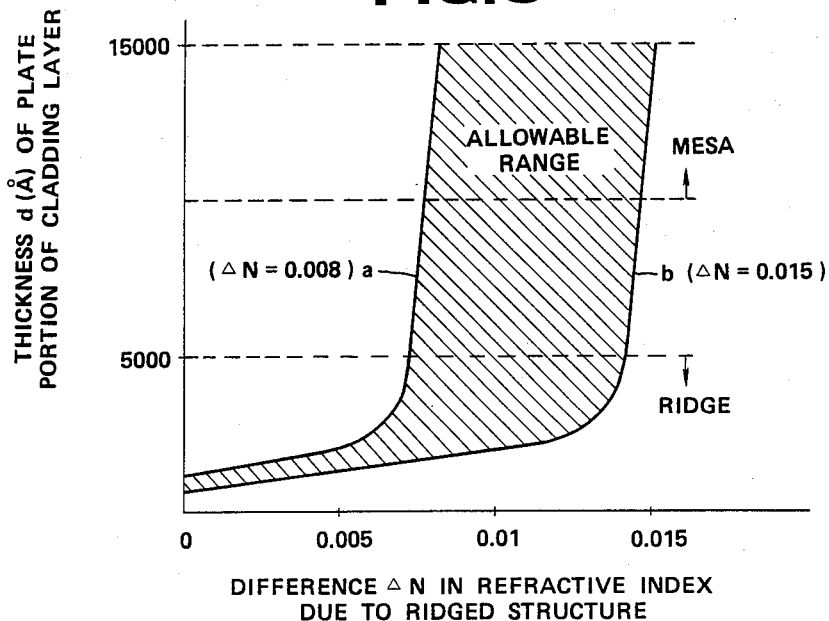
FIG. 5 is a graph of the relationship between the difference $\Delta N$ in refractive index due to the ridged waveguide structure and the thickness d of the plate portion of the cladding layer in which the total difference in refractive index due to the ridged and strip waveguide structures is within the allowable range of from 0.008 to 0.015.

FIG. 5 shows the relationship between the difference $\Delta N$ in refractive index to the ridged waveguide structure and the thickness d of the plate portion of cladding layer 20 on the basis of FIGS. 3 and 4, in which the total difference $\Delta N$ in the refractive index due to the ridged and strip waveguide structures is within the allowable range. In FIG. 5, the curved lines a and b correspond to $\Delta N$ equals 0.08 and $\Delta N$ equals 0.015, respectively. The thickness d of the plate portion of the cladding layer is assumed to be less than 5,000Å in the ridged waveguide structure. When the thickness d is greater than about 5,000Å, the difference $\Delta N$ in refractive index begins to be observed. As seen from FIG. 5, when there is no effect due to the strip waveguide structure, the allowable range represented by the shaded area of the plate portion thickness d of the cladding layer 20 is very narrow. Although it is possible to prevent the flow of electrical current from spreading, relatively large stress is applied to the active layer 14 since the thickness d of the plate portion must be thin when the waveguide strip is not present. When this structure is produced by an etching process, the etching depth is about 19,000Å plus or minus 200Å and the allowable error is plus or minus 1%, so that very great accuracy is required.

In the preferred embodiment of the present invention, the range of the difference $\Delta N$ in the refractive index due to the strip waveguide structure is about 0.007 to 0.013, and the total difference $\Delta N$ in the refractive index may be from 0.008 to 0.015. The width $W_2$ of the diffraction grating may be equal to the width $W_1$ of the ridged structure. However, it is preferably larger than the width $W_1$ in order to assume that all of the electrical current passes through the diffraction grating.

In the use of this structure, when the current passage restricting effect of the ridged structure is achieved, the waveguide effect produced by the combination of the strip and ridged structures can also be achieved. It is also possible to extend the allowable error in the plate thickness to permit the ridged structure to be formed by an etching process since the waveguide effect is mainly achieved by the strip. In cases where the difference $\Delta N$ in the refractive index due to the strip is about 0.007 to 0.013 when the total difference ΔN between the refractive indices of the central waveguide and the circumference thereof is in the range of 0.008 to 0.015, the permissible error in formation of the ridged structure is greatly extended, so that the etching depth may vary within 1,500A of 16,000A. Therefore, the permissible error of etching is about 10% so that uniform results can be achieved.

The degree of current restricting effect is determined mostly by the width $W_1$ of the ridged structure and the degree of waveguide effect is determined by the width $W_2$ of the strip. According to the preferred embodiment of the invention, the widths $W_1$ and $W_2$ can be controlled independently of each other Therefore, when the width $W_1$ the ridged structure is less than the width $W_2$ of the strip, the degree of current restricting effect can correspond to the degree of waveguide effect, i.e., the area in which current flows can be made to correspond to the area of the diffraction grating so that effective high frequency modulation characteristics can be achieved.

Due to the ridged structure, the area of the electrodes 26 and 28 can be decreased so that the volume of the device can be decreased thereby making high speed modulation possible. Furthermore, the threshold voltage is 20% less than that of a mesa laser. In addition, the device of the present invention provides superior reliability and durability since etching of the active layer is not carried out.

Figure 6:
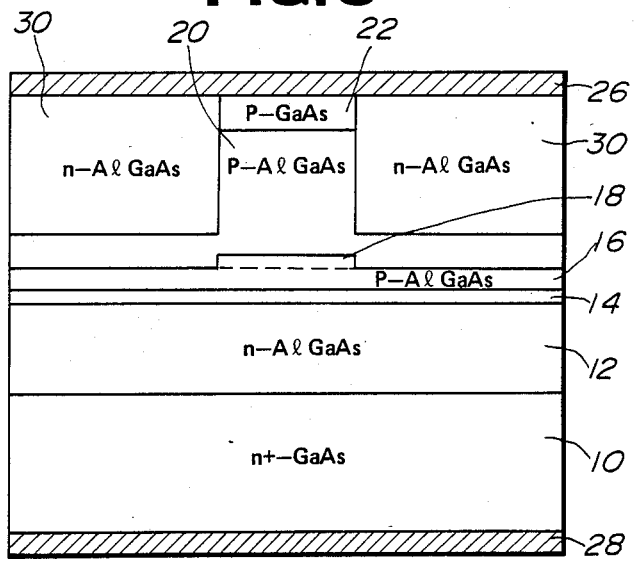
FIG. 6 is a expanded sectional view of a second preferred embodiment of a semiconductor laser device according to the present invention.
Figure 7:
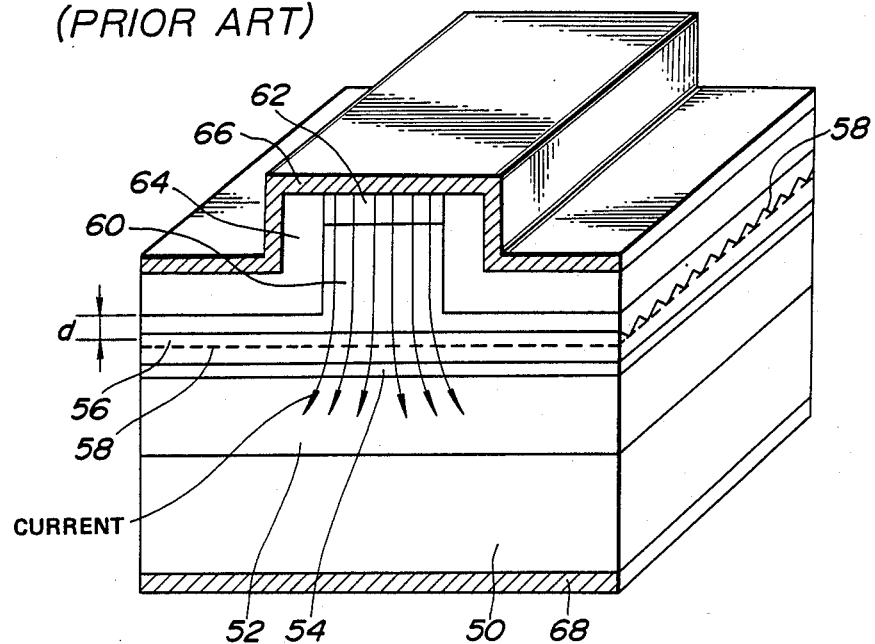
FIG. 7 is an expanded perspective view of a prior art semiconductor laser device with a ridged waveguide structure.
Figure 8:
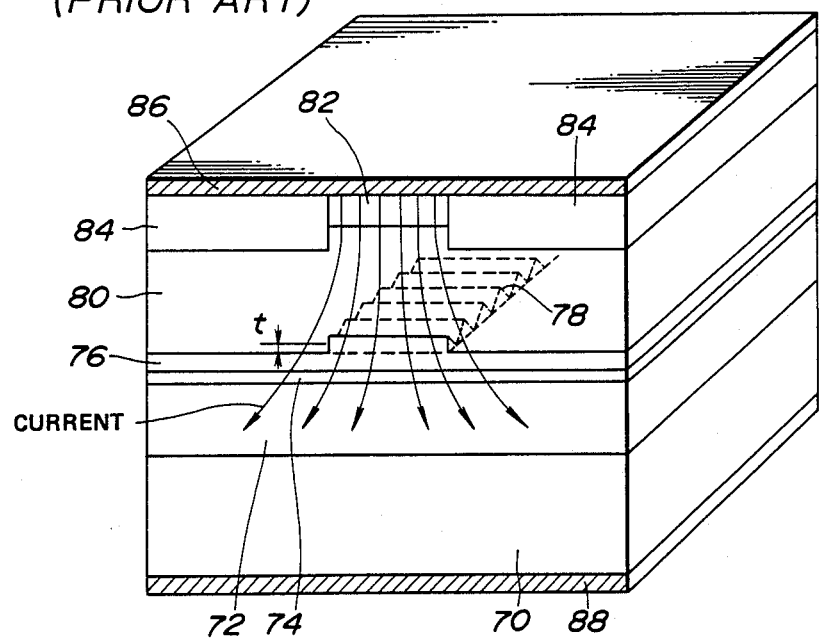
FIG. 8 is an expanded perspective view of a prior art semiconductor laser device with a strip waveguide structure.

FIG. 6 shows another embodiment of a semiconductor laser device according to the present invention in which after etching of the cladding layer 20 of FIG. 1 is performed, a flush layer 30 composed of n-type AlGaAs is formed on the removed portion of the cladding layer by an epitaxial process. In this embodiment, the flush layer 30 is provided to prevent structural stress from being concentrated at the central portion of the cladding layer 14 by the ridged structure.

It should be evident that various modifications can be made to the described embodiments without departing from the scope of the present invention.

I claim as my invention:

1. In a semiconductor laser device:
a semiconductor substrate of a first conductivity type having a major surface;
a first semiconductor layer of said first conductivity type disposed on said major surface of said semiconductor substrate;
a laser active layer disposed on said first semiconductor layer on the side opposite from said semiconductor substrate;
a second semiconductor layer of the second conductivity type disposed on said laser active layer on the side opposite from said first semiconductor layer, said second semiconductor layer having a strip waveguide structure with a first width for obtaining optical confinement, said strip waveguide structure projecting from the second semiconductor layer on the side thereof opposite from said laser active layer and extending along the central area of said second semiconductor layer in a longitudinal direction;
a third semiconductor layer of said second conductivity type disposed on said strip waveguide structure and second semiconductor layer on the side thereof opposite from said laser active layer, said third semiconductor layer having a ridged waveguide structure for defining an electrical current passage region, said ridged structure projecting from said third semiconductor layer on the opposite side from said second semiconductor layer and extending in said longitudinal direction with a second width corresponding to said strip structure, said third semiconductor layer having a plate portion and a rigid portion and has a T-shaped cross-sectional shape;
a fourth semiconductor layer of said second conductivity type disposed on said ridge waveguide structure; and
a pair of electrodes for supplying bias voltage, one of said electrodes being connected to said semiconductor substrate and the other electrode being connected to said further semiconductor layer.

2. In the semiconductor laser device of claim 1, the refractive index of a center region which extends in the longitudinal direction with a predetermined width of said third semiconductor layer differs from that of a neighboring region due to the difference in thicknesses therebetween, so that the center region serves as an optical waveguide.

3. In the semiconductor laser device of claim 1, said first width is at least equal to said second width.

4. In the semiconductor laser device of claim 2, the difference between the refractive indices of said center and neighboring regions is approximately 0.01.

5. In the semiconductor laser device of claim 2, the difference between said refractive indices of said center and neighboring regions is from 0.008 to 0.015.

6. In the semiconductor laser device of claim 5, the difference between the refractive indices of said center and neighboring regions due only to the strip waveguide structure is from 0.007 to 0.013.

7. In the semiconductor laser device of claim 1, said ridged structure projects in a direction perpendicular to said third semiconductor layer.

8. In the semiconductor laser device of claim 1, the thickness of said plate is less than or equal to 5,000A.

9. In the semiconductor laser device of claim 8, the thickness of a rigid portion of said third semiconductor layer is approximately 15,000A.

10. In the semiconductor laser device of claim 7, said strip waveguide structure projects in a direction perpendicular to said second semiconductor layer.

11. In the semiconductor laser device of claim 1, said strip waveguide structure has a periodically corrugated surface that functions as a diffraction grating, said diffraction grating including laterally extending corrugations of regular pitch and having an essentially triangular cross section.

12. In a semiconductor laser device:
a semiconductor substrate of a first conductivity type having a major surface;
a first semiconductor layer of said first conductivity type disposed on said major surface of said semiconductor substrate;
a laser active layer disposed on said first semiconductor layer on the side opposite from said semiconductor substrate;
a second semiconductor layer of a second conductivity type disposed on said laser active layer on the opposite side thereof from said first semiconductor layer, said second semiconductor having a thicker portion with a first width for obtaining optical confinement, said thicker portion projecting from said second semiconductor layer on the side opposite from said laser active layer an extending along the central area of said second semiconductor layer in longitudinal direction;

a third semiconductor layer of said second conductivity type disposed on said second semiconductor layer on the side thereof opposite from said laser active layer, said third semiconductor layer having a ridged portion for defining an electrical current passage region, said ridged portion projecting from said third semiconductor layer on the side thereof opposite from said second semiconductor layer and extending in said longitudinal direction with a second width corresponding to said thicker portion, said third semiconductor layer having a T-shaped cross-sectional shape;

a fourth semiconductor layer of said second conductivity disposed on said ridged portion; and a pair of electrodes for supplying bias voltage, one being connected to said semiconductor substrate and the other being connected to said fourth semiconductor layer.

13. In the semiconductor laser device of claim 12, the thickness of a center region of said third semiconductor layer which extends along said thicker and ridged portions in said longitudinal direction differs from that of a neighboring region thereof on the basis of the height of said thicker and ridged portions, so that the refractive index of said center region differs from that of the neighboring region.

14. In the semiconductor laser device of claim 12, said first width is at least equal to said second width.

15. In the semiconductor laser device of claim 13, the difference between the refractive indices of said center and neighboring regions is approximately 0.01.

16. In the semiconductor laser device of claim 13, the difference between the refractive indices of said center and neighboring regions is from 0.008 to 0.015.

17. In the semiconductor laser device of claim 16, the difference between the refractive indices of said center and neighboring regions on the basis of said thicker portion only is 0.007 to 0.013.

18. In the semiconductor laser device of claim 12, said ridged portion projects in a direction perpendicular to said third semiconductor layer.

19. In the semiconductor laser device of claim 18, the thicknesses of said plate portions of said third semiconductor layer which are disposed on both sides of said ridged portion are less than or equal to approximately 5,000Å.

20. In the semiconductor laser device of claim 19, the thickness of said ridged portion is approximately 15,000 Å.

21. In the semiconductor laser device of claim 18, said thicker portion of said second semiconductor layer projects in a direction perpendicular to the surface of said second semiconductor layer.

22. In the semiconductor laser device of claim 11, said thicker portion has a periodically corrugated surface serving as a diffraction grating, said diffraction grating being composed of laterally extending corrugations of regular pitch and essentially triangular cross section.

23. In a distributed feedback semiconductor laser device:

a semiconductor substrate of a first conductivity type having a major surface;

a first semiconductor layer of said first conductivity type disposed on said major surface of said semiconductor substrate;

a laser active layer disposed on said first semiconductor layer on the side thereof opposite from said semiconductor substrate;

a second semiconductor layer of a second conductivity type opposite said first conductivity type, disposed on said laser active layer on the side thereof opposite from said first layer and including a strip waveguide structure having a periodically corrugated surface that functions as a diffraction grating, said strip waveguide structure projecting from said second semiconductor layer on the side thereof opposite from said laser active layer and extending over the central area of said second semiconductor layer in a longitudinal direction with a first width, and said corrugated surface having corrugations which extend in a lateral direction perpendicular to said longitudinal direction;

a third semiconductor layer of said second conductivity type disposed on said strip waveguide structure and second semiconductor layer on the side thereof opposite from said laser active layer, said third semiconductor layer having a ridged waveguide structure for defining an electrical current passage region, said ridged structure projecting on the side thereof opposite from said second semiconductor layer and extending in said longitudinal direction, having a second width corresponding to said strip structure, said third semiconductor layer having a T-shaped cross-sectional structure;

a fourth semiconductor layer of said second conductivity type disposed on said ridged waveguide structure; and a pair of electrodes supplying bias voltage, one electrode being connected to said semiconductor substrate and the other electrode being connected to said fourth semiconductor layer.

24. In the distributed feedback semiconductor laser device of claim 23, the refractive index of the center region which extends in said longitudinal direction with a predetermined width of said third semiconductor differs from that of a neighboring region thereof due to the difference in thickness therebetween, so that the center region serves as an optical waveguide.

25. In the distributed feedback semiconductor laser device of claim 24, said first width is at least equal to said second width.

26. In the distributed feedback semiconductor laser device of claim 24, said refractive index of said center region is approximately 0.01.

27. In the distributed feedback semiconductor laser device of claim 24, said refractive index of said center region is from 0.008 to 0.015.

28. In the distributed feedback semiconductor laser device of claim 27, said refractive index of said carrier region due to the strip waveguide structure only is 0.007 to 0.013.

29. In the distributed feedback semiconductor laser device of claim 23, said ridged structure projects in a perpendicular direction to said third semiconductor layer.

30. In the distributed feedback semiconductor laser device of claim 29, said third semiconductor comprises a plate portion and a ridged portion that define the T-shaped cross section.

31. In the distributed feedback semiconductor laser device of claim 30, the thickness of said plate portion is less than or equal to 5,000Å.

32. In the distributed feedback semiconductor laser device of claim 31, the thickness of a rigid portion of the third semiconductor layer is approximately 15,000A.

33. In the distributed feedback semiconductor laser device of claim 29, said strip waveguide structure projects in a direction perpendicular to said second semiconductor layer.

34. In the distributed feedback semiconductor laser device of claim 29, said diffraction grating is composed of corrugations of regular pitch and essentially triangular in cross section.

* * * * *